United States Patent

Miller

[15] 3,649,273

[45] Mar. 14, 1972

[54] PRINTED CIRCUIT PROCESS AND ARTICLES

[72] Inventor: Genevieve Gayle Miller, Los Angeles, Calif.

[73] Assignee: Bishop Graphics, Inc., North Hollywood, Calif.

[22] Filed: June 9, 1969

[21] Appl. No.: 831,381

[52] U.S. Cl. ....................................... 96/36.2, 96/41, 96/43, 95/1, 96/38.4

[51] Int. Cl. ....................................... G03c 5/00, G03c 5/04

[58] Field of Search ...................... 96/41, 43, 36.2, 119, 38.4; 95/1, 85

[56] References Cited

UNITED STATES PATENTS

| | | | |
|---|---|---|---|
| 3,169,063 | 2/1965 | Johnston et al. | 96/41 X |
| 3,264,106 | 8/1966 | Alldis | 96/41 |
| 3,445,921 | 5/1969 | Leenhouts | 95/1 |

OTHER PUBLICATIONS

Artype Inc. Catalog– Copyright 1946. pp. 1, 5 12, 13 and 16 made of record.

*Primary Examiner*—David Klein
*Attorney*—Allan M. Shapiro

[57] ABSTRACT

Printed circuit process and articles for manually producing a modifiable pattern mask structure for use in standard printed circuit board exposure and etching techniques. Flexible pattern members comprise a thin flexible base sheet with opaque patterns having transparent pattern openings therein printed on the sheet in negative form, i.e., transparent pattern openings surrounded by an opaque background. The pattern member is provided on its undersurface with a pressure-sensitive adhesive. Pattern members are arranged according to circuit design requirements on a thin transparent substrate. Interconnecting circuit lines are marked as with white chalk on the opaque patterns of the pattern members to usually establish conductor paths. Conductor path patterns are formed by cutting through the pattern members along the edges of the chalk marks and peeling off the cut path portions of the pattern members from the substrate, the resulting article constituting a pattern mask for direct use in conventional circuit board printing. The pattern on the pattern mask can be directly modified subsequently to change or correct the circuit design.

8 Claims, 7 Drawing Figures

INVENTOR.
GENEVIEVE GAYLE MILLER
BY Allan M. Shapiro
ATTORNEY

PRINTED CIRCUIT PROCESS AND ARTICLES

BACKGROUND OF THE INVENTION

1. Field of the Invention

This invention is directed to a printed circuit process and articles for manually providing a modifiable pattern mask structure for direct use in conventional circuit board printing.

2. Description of the Prior Art

The printed circuit board was originally conceived as an economical way of producing complex circuits in mass production. Such circuits are produced by starting with a printed circuit board blank. This blank is an insulative substrate with a layer of metal conductor, usually copper, on at least one side. The copper is coated with a layer of material known as photoresist. The photoresist is exposed to light in such a manner that, where it is desired that copper remain, light is impinged upon the photoresist. This light exposure is accomplished with a photographic negative having transparent areas where copper is desired. Following the exposure step, the unexposed photoresist is removed by washing it away in a suitable solvent. The solvent removes the unexposed photoresist and leaves the exposed, hardened photoresist upon the board in the areas where copper is desired. Following photoresist removal, the exposed copper is etched away in a suitable etchant solution. As the next step, the remaining photoresist over the remaining copper is removed to expose the copper. The printed circuit board is now ready for installation of electronic components.

It can be seen that such a process can quickly and with a minimum of effort provide mass production of circuits of a fair amount of complexity. It is clear that the pattern of the photographic negative is faithfully reproduced on each printed circuit board. The usual prior method of producing such a photographic negative has included the preliminary step of drafting a pattern upon ordinary drawing material. For drafting convenience, the pattern is often drawn at a multiple size, as compired to the desired resultant printed circuit board. As is convenient in drafting practice, the drafted art work of the desired printed circuit board is represented in black, or other dark color, where a conductor is desired on the finished printed circuit board, against the light background of the drafting paper. After completion of the art work, a reversal of the art work is obtained by simply photographing the art work to obtain a photographic negative. In such operations, reduction of size is conveniently managed, with the result that the original art work could be made oversize, as previously stated. The resultant photographic negative is employed to expose the printed circuit board, as described above.

It is clear that the steps of drafting the desired pattern, followed by the described photographic negative production, requires the proper photographic equipment, and requires sufficient time to process the negative. Such time is available in mass production jobs but, in the creation of a printed circuit board for experimental breadboard-type operations as well as preproduction prototypes, it is unduly time-consuming and expensive. Perhaps even more importantly, the photographic negative, once produced, cannot be modified subsequently to change or correct the circuit design; such modifications require almost complete repetition of the process, including the photographic steps. Hence, it is highly desirable to be able to produce a printed circuit pattern mask which represents the desired circuit board pattern without going through the photographic negative production step, and which can be modified subsequently to accommodate changes and/or corrections in circuit design. Such would save considerable time on experimental, research, breadboard and short-run printed circuit board applications.

SUMMARY OF THE INVENTION

In order to aid in the understanding of this invention, it can be stated in essentially summary form that it is directed to a printed circuit process and articles for manually producing a modifiable printed circuit pattern mask article. Flexible pattern members comprise a thin flexible base sheet with opaque patterns having transparent pattern openings therein printed on the sheet in negative form, i.e., transparent pattern openings surrounded by an opaque background. The pattern member is provided on its undersurface with a pressure-sensitive adhesive. Pattern members are arranged according to circuit design requirements on a thin transparent substrate. Interconnecting circuit lines are marked as with white chalk on the opaque patterns of the pattern members to visually establish conductor paths. Conductor path patterns are formed by cutting through the pattern members along the edges of the chalk marks and peeling off the cut path portions of the pattern members from the subtrate, the resulting article constituting a pattern mask for direct use in conventional circuit board printing. The pattern on the pattern mask can be directly modified subsequently to change or correct the circuit design. Thus, the process comprises the steps of providing a transparent substrate, adhesively securing thereto a plurality of the pattern members having pattern openings therein, and cutting out desired interconnecting channels between selected transparent markings in the opaque layer so that a pattern mask is produced.

Accordingly, it is an object of this invention to provide a printed circuit pattern mask which can be manually produced by adhesively securing to a transparent substrate an opaque layer, so that the opaque layer can be cut out in paths representing conductors in a printed circuit board. It is another object to provide a pattern member which comprises an opaque layer of flexible material having a plurality of transparent pattern openings therein, and having an adhesive backing so that the pattern member can be easily secured to a transparent support, and the later of material can be cut away on selected lines so as to produce a plurality of interconnected, transparent channels. It is still another object to provide a pattern mask which can be manually and directly produced and perform the function of a photographic negative in the light exposure of photoresist-coated printed circuits boards. It is a further object to provide a process by which a printed circuit board can be quickly and conveniently produced. It is a general object to provide a process and means for producing a printed circuit pattern mask without the previously described disadvantages of the prior art.

Still other objects, features and attendant advantages of the present invention, together with various modifications, will become apparent to those skilled in the art from a reading of the following detailed description of the preferred embodiment constructed in accordance therewith, taken in conjunction with the accompanying drawings wherein like numerals designate like parts in the several figures.

DESCRIPTION OF THE PREFERRED EMBODIMENTS

Figure 1:
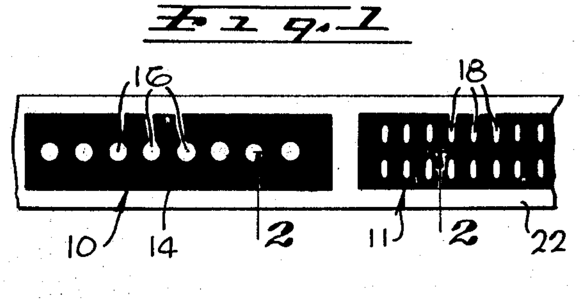
FIG. 1 is a top plan view of several of the pattern members in accordance with this invention.
Figure 2:
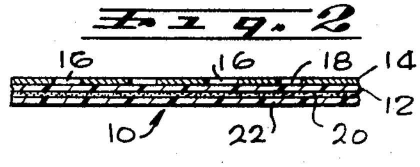
FIG. 2 is a vertical section taken generally along the line 2—2 of FIG. 1, showing the structure of the pattern members.

Referring particularly to FIGS. 1 and 2, the pattern members of this invention are indicated at 10 and 11, and are seen to comprise a thin layer or sheet 12 of material which is flexible and transparent. As used herein, the term "transparent"

obviously includes translucent. Preferably, sheet 12 is a matte acetate or mylar material of about 1.5 mil thickness. It carries a selectively deposited, opaque coating 14 so that pattern openings 16 are left therein. Pattern openings 16 are arranged in convenient form to be of such size and shape as will be desired by the designer, and are preferably oriented with respect to each other on an individual pattern member 10 in such manner that pattern openings may be used in groups. Pattern openings 16, on the left end of FIG. 1 on pattern member 10, are in the form of circles having an opaque dot in the center. Pattern openings 18, in pattern member 11 on the right end of FIG. 1, are of similar character, but are arranged as double rows of rectangular patterns having rounded ends and an opaque dot in the center.

The individual patterns of which pattern members 10 and 11 are illustrative carry pressure-sensitive adhesive 20 on the undersurface thereof and, to protect the adhesive of the pattern members, are mounted on a slipsheet or paper backing 22 as they are manufactured and from which they can be conveniently removed as by peeling for use. The individual pattern members are of sufficiently thin material so that they can be conveniently cut through. The material is chosen with this in mind. Enough pattern members are provided with pattern openings therein of different configurations as may be desired for use. The two patterns illustrated in FIG. 1 are merely illustrative, and it is clear that many other types or styles may be provided.

Figures 3, 4, 5, 6:
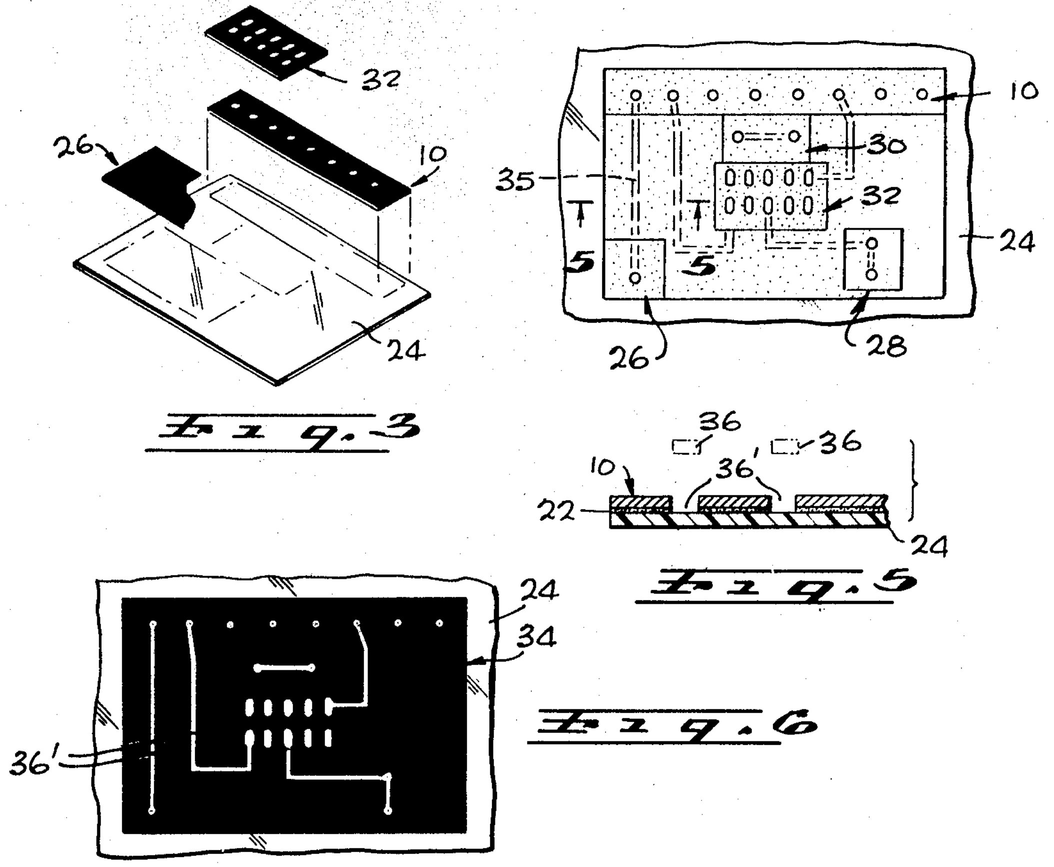
FIG. 3 is an exploded perspective view showing the manner in which the pattern members of FIG. 1 are disposed on a transparent substrate.
FIG. 4 is a top plan view showing the pattern members arranged in place on a transparent substrate.
FIG. 5 is an enlarged section taken generally along the line 5—5 of FIG. 4.
FIG. 6 is a top plan view of the completed pattern mask.

FIG. 3 illustrates the step in the process wherein the pattern members are employed in creating a pattern mask. A plurality of pattern members are removed from their slipsheet backing and are adhesively secured onto a transparent substrate 24. As illustrated in FIG. 3, a pattern of pattern member 10 is employed in a single row across the top of the substrate. It is secured in position as is shown in FIG. 4. Next, portions of additional patterns identical to pattern member 10 are selected and portions of pattern member 10 are secured to the substrate 24, as indicated at 26, 28 and 30. Next, a pattern member having the pattern openings 18, as shown at 11 in FIG. 1, is removed from the slipsheet backing 22 and is secured to the transparent substrate 24 as generally indicated at 32. Normally, sufficient pattern members 10 and 11, and identical members bearing such other patterns as are desired, are disposed upon the substrate in such positions as to substantially or completely cover the substrate. However, when the substrate is not completely covered within the confines of the desired pattern mask, additional pattern members bearing a completely opaque pattern are placed between the patterns having openings therethrough. No particular care need be exercised in location of the completely opaque pattern members, their function being merely to completely fill in the background not already covered by the opaque pattern areas surrounding the transparent openings in the pattern members; thus, the opaque members may overlap onto the pattern members and preferably do so, the thickness of the pattern members being so slight that the combined thickness at overlapped regions is negligible. Thus, when completed, within the confines of the pattern mask, the substrate is completely opaqued, except for the pattern openings within the pattern members placed thereon. The pattern mask outline is indicated at 34, and is now ready for the making of circuits interconnecting the pattern openings.

As is illustrated in FIG. 4, the pattern openings are visible to the viewer and the remainder of the field within the bounds of pattern mask 34 is opaque. Since the intention is to define a printed circuit board, and to define the circuits thereon, it is desired that interconnections be indicated between the various pattern openings. In the designing step, markings as at 35, indicated by substantially parallel broken lines, can be initially made by chalking tentative circuits onto the opaque surface provided by opaque coating 14 (see FIGS. 1 and 2). After the circuits are arranged to satisfaction, the chalk marks 35 can serve as indications of where the connecting lines are to be located. The chalk lines are indicated in dotted lines in FIG. 4 as at 35.

As the next step, the pattern members are scribed through along the chalk lines 35 from one pattern opening to another. As is indicated in FIG. 5, the pattern members are cut through on substantially parallel lines. The residue 36 of the pattern members between the lines is referred to as a connection strip and is removed by merely peeling it off of the substrate 24, thus forming channels 36'. This step results in the finished pattern mask shown in FIG. 6. The pattern mask of FIG. 6 is a built-up structure of pattern members upon the substrate 24, together with cutout interconnecting channels 36' cut right through the pattern members to the substrate. Thus, the pattern mask is transparent in the pattern openings and cutout channel sections while the remainder is opaque.

It should be noted that the pattern members are completely cut through, as by an Exacto knife, with the cutting or scribing implement thus bearing against the substrate 24. Accordingly, it will be understood that the substrate 24 is composed of a material and has a thickness such that cutting of the interconnection channels 36' does not cause cutting through of the substrate 24.

Figure 7:
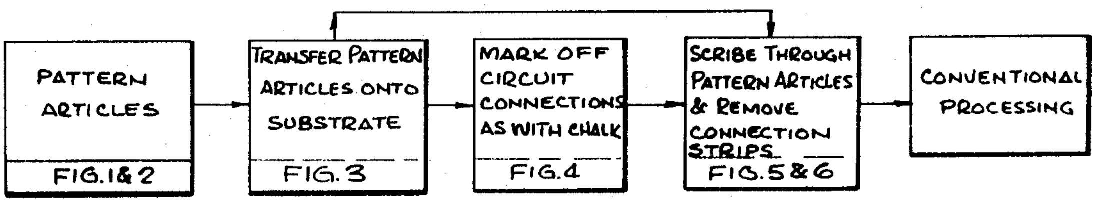
FIG. 7 is a schematic block diagram illustrating the steps of the process, with references to the other FIGURES incorporated therein.

It also will be noted, as indicated in FIG. 7, that the marking step may be omitted, with the designer proceeding directly to cutting of the interconnection channels without prior marking thereof; however, the marking step is preferred because it permits very rapid circuit design and flexibility, since the markings are easily changed before the cutting step by merely rubbing off and newly marking the chalk or similar lines.

The pattern mask 34 is employed in conventional printed circuit board processing, including placing the pattern mask against a photoresist-covered board, exposing through the pattern mask, washing away the unexposed photoresist, and etching away the unprotected metal. After the remaining photoresist is removed, the metal on the printed circuit board corresponds to the open areas in the pattern mask. Accordingly, a faithful reproduction of a printed circuit board is obtained without going through the usual drafting steps and the production of a photographic negative.

Thus, the process of this invention comprises the steps of providing a pattern member of cuttable material, the pattern thereon being opaque except for pattern openings therein. The next step is placing the pattern members on a substrate in such orientation as to provide the desired orientation of the pattern openings. This preferably is followed by the step of marking off the desired circuit with chalk, or other temporary marking means. The pattern mask is completed by cutting through the opaque areas of the patterns along the chalk-indicated lines and removing the opaque connection strips from the channels to provide visual interconnecting channels therebetween. Thereupon, the completed pattern mask is employed in conventional printed circuit board processing to produce a corresponding printed circuit board without the delays of photographic processing.

It is clear from the above description of the process that the cutout areas produce exposure through the pattern mask. If an error is made in the cutting operation, such can be corrected by adhesively securing over the objectionably cut area another piece of blank pattern material, not having pattern openings therein. Alternatively, opaque correction paint can be employed. Similarly, if an error is made in the construction of the pattern mask, in the layout of the circuit, or in the engineering design of the circuit, none of which errors is discovered until after completion of the pattern mask or even completion and testing of the final electronic product, or in the event a change in the circuit or any part thereof becomes desirable at a later date, direct modification of the pattern mask is readily accomplished without the necessity of proceeding through all of the drafting and photographic steps otherwise necessary under the prior art.

For convenience of the small operator or laboratory, in use of the printed circuit process of this invention, the materials are conveniently furnished in kit form. An appropriate kit includes assorted pattern members 10 having various symbols thereon, and a supply of substrate 24, which can be transparent acetate. The kit can also include black tape for covering the spaces between patterns, as well as black paint for correction of cutting errors or blanking out pattern openings which are not desired, and the kit can also include a knife of appropriate character for cutting the channels. Thus, all of the necessary items for producing a pattern mask are conveniently and economically furnished.

This invention having been described in its preferred embodiments, it is clear that it is susceptible of numerous modifications and embodiments within the ability of those skilled in the art and without the exercise of the inventive faculty.

I claim:

1. The process of forming a pattern mask comprising the steps of:

providing a plurality of pattern members, with each pattern member being formed of a flexible sheet and being opaque except for pattern openings therethrough, and having a pressure-sensitive adhesive on one side thereof;

adhesively securing one of said pattern members to a transparent substrate;

adhesively securing another of said pattern members to said substrate so that an area of said substrate is rendered opaque except for pattern openings in said pattern members; and cutting through said pattern members to said substrate in channels interconnecting selected ones of said patterns openings so that the channels form connectors between selected pattern openings which connectors are transparent through said substrate so that a pattern mask is formed.

2. The process of claim 1 wherein said channel-cutting step is preceded by a marking step wherein said opaque material is marked to indicate where said channels are to be cut.

3. The process of claim 2 further including the succeeding step of exposing a photoresist-covered circuit board through said pattern mask so that a printed circuit board can be formed in accordance with the pattern openings and channels in said pattern mask.

4. A pattern mask for use in exposing photoresist-coated circuit boards for the production of printed circuit boards, said pattern mask comprising:

a transparent substrate;

a plurality of pattern members secured to said substrate, each of said pattern members comprising:

a sheet of flexible transparent material having an opaque coating printed on the upper surface of said sheet and pattern openings in said opaque coating, and a layer of pressure-sensitive adhesive on the undersurface of said sheet, said adhesive engaging said substrate to secure said pattern members to said substrate, said pattern members being in overlapping relationship;

channels cut through said pattern members to said substrate from selected ones of said pattern openings to other selected pattern openings so that said pattern mask is opaque except for said channels and said pattern openings.

5. A pattern mask for use in exposing photoresist-coated circuit boards for the production of printed circuit boards, said pattern mask comprising:

a transparent substrate;

a plurality of pattern members secured to said substrate, each of said pattern members comprising:

a sheet of flexible material having an opaque area and having at least one transparent pattern opening in said opaque area, adhesive on said sheet, said adhesive engaging said substrate to secure said pattern members to said substrate, said pattern members having their opaque areas positioned so that there is no transparent area therebetween; and channels cut through said pattern members to said substrate from selected ones of said pattern openings to other selected pattern openings so that said pattern mask is opaque except for said channels and said pattern openings.

6. The pattern mask of claim 5 wherein said adhesive is a pressure-sensitive adhesive.

7. The pattern mask of claim 5 wherein said opaque area of each of said plurality of pattern members extends from edge to edge of each of said plurality of pattern members, except for pattern openings therein.

8. The pattern mask of claim 5 wherein at least some of said opaque areas are in overlapping relationship to each other.

* * * * *